United States Patent [19]

Hahn

[11] 4,393,310

[45] Jul. 12, 1983

[54] METHOD OF AND DEVICE FOR ADJUSTING A SHAPED-ELECTRON-BEAM WORKING DEVICE

[76] Inventor: Eberhard Hahn, 9, Pestalozzistrasse, Jena, District of Gera, German Democratic Rep.

[21] Appl. No.: 502

[22] Filed: Jan. 5, 1979

[30] Foreign Application Priority Data

Jan. 19, 1978 [DD] German Democratic Rep. .................................... 01203296

[51] Int. Cl.³ ............................................. H01J 37/26
[52] U.S. Cl. ................................... 250/398; 250/492.1
[58] Field of Search ........... 250/492 A, 492 B, 396 R, 250/397, 398, 310, 311; 313/359, 361; 219/121 EB, 121 EM

[56] References Cited

U.S. PATENT DOCUMENTS

| | | | |
|---|---|---|---|
| 3,952,198 | 4/1976 | Harada et al. | 250/397 |
| 4,071,765 | 1/1978 | Oostrum et al. | 250/397 |
| 4,075,488 | 2/1978 | Okayama et al. | 250/398 |
| 4,097,740 | 6/1978 | Müller et al. | 250/397 |
| 4,151,422 | 4/1979 | Goto et al. | 250/492 A |

Primary Examiner—Bruce C. Anderson

[57] ABSTRACT

This invention is in concern of a method of and a device for adjusting a shaped-electron-beam working device which includes means for deflecting a shaped electron beam in the target plane and means for varying the shaped, preferably rectangular electron beam. The working device is adjusted with respect to the adjustment categories pupil, format or shape, and with respect to format calibration. The adjustment operations are performed substantially without any back-effects upon already obtained adjusted positions so that considerably short adjustment times are obtained.

The inventional adjustment method provides a definite adjustment sequence for correcting aberrations visualized via display means, and also provides the device for performing the necessary steps.

The invention is employed preferably in lithographic devices for producing microcircuits.

5 Claims, 15 Drawing Figures

METHOD OF AND DEVICE FOR ADJUSTING A SHAPED-ELECTRON-BEAM WORKING DEVICE

The invention is in concern of a method of and device for adjusting a shaped-electron-beam working device of the corpuscular radiation type, particularly for target irradiation, comprising means for varying the position of the electron beam on the target, and means for varying the preferably rectangular shape of the beam cross-section. Such electron beam devices are used, for example, to produce pre-programmed irradiation patterns in semiconductor materials in the course of producing micro-electronic circuits. In The DD Patent specification WP No. 126 438 such an electron beam working device is disclosed.

In contrast to the electron probe devices using finely focused electron beams, the device operating according to the shaped electron beam principle features a considerably high productivity, due to the fact that the electron beam permits to be programmed in two respects, namely to its position in the field of operation and to its preferably rectangular cross-section (format) at an unvarying edge definition and intensity.

While conventional methods also used with electron probe devices, are employed for placing the shaped electron beam on the target, for example, the digitally controlled deflection, the program controlled variation of the electron beam cross-section, the setting of the format, requires a particular electron optical illumination system.

The above mentioned patent specification describes two alternative methods of the kind. In the first, the size of the irradiation field aperture is set by mechanical motion of aperture edges.

In the second, the edges which limit the beam are mechanically non-displaceably arranged in different, optically conjugate planes and the size of the beam cross-section is set by electron-optical means. The second method permits a considerably high format setting speed which is even higher than the adjustment of the electron beam at definite positions on the target effected through the positioning system. It lies in the nature of the shaped electron beam that the requirements for adjustment of the electron optics are considerably higher than in a device operating according to the electron probe principle.

In the course of the mosaic-like composition of the irradiation patterns by means of the electron beam exposure failures or over-exposure may occur in the overlapping portions of the individual mosaics unless means are provided that each side of the beam cross-sectional area is accurately in parallel to the x- and y-deflection direction of the positioning system (format adjustment) and has a length required by the format control (format calibration).

Furthermore, the illumination system requires a precise focusing of the crossover image onto the tilt plane of the format control system and an accurate adjustment of the same as entrance pupil onto the optical axis of the objective and onto the opening of the scanning aperture, respectively, provided that the latter is kept to so small a size, in order to eliminate any interfering stray background, that the crossover image edges are cut and hence becomes effective as an aperture.

In previous electron optical devices as disclosed in the DD Patent specification No. 113 416, the fundamental function of an electron beam radiation device operating according to the area scanning principle is known.

Said device includes an illumination field limitation which is electron optically controlled and a method of and a device for adjustment of the pupil.

There are, however, neither a device nor a method for format adjustment and format calibration disclosed in literature. The previous art in the field is illustrated in more detail in connection with FIG. 1.

The known electron optical means which affect the electron beam in such a manner that it impinges onto the target in the required intensity and format do not satisfy their task without back-effects.

Hence, the adjustment of an electron beam is complicated and time consuming.

Furthermore, the known adjustment method does not permit a unique decision whether there is any astigmatism in the first intermediate pupil or not.

It is an object of the present invention to obviate the above disadvantages.

It is a further object of the present invention to increase considerably the effectivity in a shaped electron beam device operating according to the area scanning principle in reducing adjustment times otherwise required.

This permits a better monitoring of the adjustment state so, for example, after each exposure of a semiconductor wafer, which, in turn, involves a reduction of the rejects rate in production.

It is still a further object of the present invention to embody an electron optical illumination system in such a manner that the adjustment operations are considerably simplified in particular, the adjustments of the pupils, of format and also a calibration of the format so that any aberrations can be compensated for rapidly and purposely. These and other objects are realised by a method of and device for adjusting a shaped-electron-beam working device in which a first angular aperture is imaged onto the plane of a second complementary angular aperture so that a rectangularly beam shape results which is demagnified via an objective and imaged onto the target plane where it is deflected in x- and/or y-direction, and in which the crossover of the beam source is imaged onto the tilt plane of a format varying system and from there into the plane of the aperture (entrance pupil) of the objective with respect to pupil adjustment, format adjustment and format calibration, in that the electron beam cross-sections are imaged in a time sequence having typical features which can be uniquely associated to the aberrations to be corrected.

The adjustment categories are the pupil adjustment, format adjustment and format calibration.

The respective aberrations are eliminated in setting the adjustment parameters to their nominal values.

Back-effects on adjustments already performed are avoided in that both, the sequence of the imaging operations and the sequence of the adjustment parameters to be set are definite ones, and the selection and the arrangement of the adjustment means permit these steps.

According to the invention the following adjustment steps are carried out:

(A) imaging of the aperture and focusing of the entrance pupil onto the aperture plane for pupil preadjustment, (B) imaging of the target plane and cyclic positioning of a zero-format in x- and y-direction in the target plane in steps having the width of the zero-format and subsequent correction for aberrations visible at the format edges, such as the "wedge" aberration, parallelogram aberration, depth error and difference in brightness in the four adjacent corners of the zero-format for format adjustment.

(C) Imaging of the aperture diaphragm and cyclic format positioning in x- and y-direction, in combination with a cyclic formate variation, which is performed in x- and y-direction phase shifted, and subsequent correction of the pupil displacement occuring for pupil adjustment, (D) imaging of the target plane and cyclic positioning of the format at a simultaneous variation of the format in analogy to step C, and the correction of the depth error visible at the format edges for format calibration.

Advantageously, an additional adjustment step follows the correction of the "wedge" error consisting in a further imaging of the aperture diaphragm, and a pupil astigmatism visualized through beam "wobbling" is eliminated.

A special case of the inventional method, described in more detail hereinafter, is characterised in the following steps:

In the steps A to D the step A is substituted by an imaging of the angular aperture and wobbling of the beam centering having a tilt about the first angular aperture and subsequently thereto, an oscillation of the angle sides in the image of the first angular aperture and a remaining opposite focusing difference of the two angle sides in the image of the first angular aperture are eliminated. The invention includes means for carrying out the inventional method.

A system for adjusting a shaped-electron-beam working device comprises a first angular aperture which is imaged through condenser lenses into the plane of a second complementary angular aperture which results in a rectangular beam cross-section. The latter is demagnified through an intermediate lens and an objective and imaged into a target plane.

The rectangular beam area is positioned in the target plane by a respective positioning system.

Furthermore, a crossover of the beam source is imaged into a tilt plane of a two-staged deflection system by a first condenser lens to obtain a "format" or shape variation of the beam cross-section.

A second condenser lens and an intermediate lens image the crossover from the tilt plane into the plane of the entrance pupil of the objective.

Furthermore a beam centering system is provided for aligning the beam relative to the first angular aperture and relative to an aperture diaphragm or blanking aperture which lies in the plane of the entrance pupil. Said beam centering system includes a number of stigmators for controling the beam. Said system for adjusting an electron beam aims at a reduction of the number of the adjustment parameters in routine operations to only a few ones.

According to a first feature of the invention the condenser lens system is embodied in such a manner that a definite adjustment condition namely, the imaging of the first angular aperture onto the second angular aperture is satisfied when a further adjustment operation is carried out, namely, the focusing of the crossover image into the plane of the aperture diaphragm.

The latter adjustment operation, which has to be performed anyway, is easier to be monitored compared to the former adjustment operation.

To this end, a distance a between the crossover and the first angular aperture and a distance b between the first angular aperture and the object side principle plane of the first condenser lens, a distance c between the image side principle plane of the first condenser lens and the object side principle plane of the second condenser lens, the distance d between the image side principle plane of the second condenser lens and the second angular aperture, and the distance e between the second angular aperture and the plane of a second intermediate pupil are so dimensioned that the term $$D = 1 - 4\frac{b}{c} \cdot \frac{d}{c}\left(1 + \frac{b}{a}\right)\left(1 + \frac{d}{e}\right)$$

equals zero.

A second feature of the inventional device relates to the correction of the parallelogram error of an angle side of the image of the first angular aperture relative to its conjugate image of the second angular aperture.

Heretofore this has been realised by exploiting the image rotation effects of the condenser lenses in that one condenser lens is less excited than the other one, which involves the disadvantage that different adjustment parameters are affected.

Thus, the imaging of the pupil into the tilt plane of the format or shape varying system is rendered out of focus and also the imaging scale of the plane of the first angular aperture into the plane of the second angular aperture is varied.

In order to obviate these disadvantages of a coil for weak excitation is inserted coaxially to the axis of the system between the condenser lenses about the first intermediate pupil.

Said coil eliminates any back-effects upon the focusing and the scale of the images and only is operative as a rotation lens, however, also rotating the deflection direction of the upper stage relative to the lower stage of the format or shape varying system.

According to a third feature of the invention, the setting of the stigmators for compensation of astigmatism in the first intermediate pupil is concerned.

Astigmatism is disadvantageous with respect to format or beam shape variations and to the homogeneity and constancy of the intensity of an electron beam cross-section. Astigmatism is not directly traceable since a stigmatic image of the crossover in the plane of the second intermediate pupil and in the plane of the third intermediate pupil, respectively, the plane of the aperture diaphragm, is not relevant enough as a criterion for adjustment.

This is obviated by a third feature of the present invention in which a further, more strongly excitable coil is arranged coaxially to the system axis about the first intermediate pupil and the excitation of the coil is wobbulated during setting of the stigmators so that an alternating image rotation of, for example $\pm 15°$ occurs between the plane of the first intermediate pupil and the plane of the second intermediate pupil which involves a corresponding periodic variation of the traceable astigmatism in the plane of the aperture diaphragm when the astigmatism occuring in the first intermediate pupil is not compensated for.

A fourth feature of the invention relates to the alignment of the angle included by the angle sides of the imaged first angular aperture and of the second angular aperture relative to the basic angle included by the x- and y-deflection direction of the positioning system, the latter angle preferably being a right angle.

The alignment operation is carried out without misaligning the previously performed adjustments of the electron optical imaging, in particular the stigmatic pupil imaging. The compensation for the pupil astigmatism, in turn, is required to be without back-effects upon the orthogonality of the angle sides of the beam cross-section.

According to the fourth feature of the present invention this is realised by a number of weakly excitable quadrupoles in the condenser lens system.

Said quadrupoles are arranged in such groups of at least two electrically connected in series so that a desired effect in the quadrupoles is enhanced when a definite group is excited whereas other undesired effects in the other groups are compensated, due to the optical symmetry in the principle path of rays of the condenser lens system.

A fifth feature of the invention relates to the requirement for invariance of the edge definition and the intensity in the beam cross-section when the format or shape is varied as desired within the adjustable format range. Most reasons for errors with respect to the above are to be found in an undesired transversal aberration of the crossover image in the aperture diaphragm opening depending on various other reasons.

When the plane of the first intermediate pupil does not coincide with the tilt plane of the format or shape varying system the pupil is displaced in the same or in the opposite direction of the opening or closing of the format or shape. When the first intermediate pupil is focused into the tilt plane of the format deflection system this component of pupil displacement can be eliminated but there remains an interfering transversal component which has its origin in a not very accurate deflection of the format or shape varying system.

For example, there must not be a non-displaceable tilt point with respect to all deflection directions possible.

According to the fifth feature of the invention two deflection stages in the format varying system are subsequently located in the direction of the electron beam propagation, each of said deflection stages consists of two crosswise arranged deflection coils, coupled via their deflection currents $u_x$, $u_y$ in the upper stage and $v_x$, $v_y$ in the lower stage, by the matrix terms of the type of an affine transformation $$u_x = a_{11} v_x + a_{12} v_y$$
$$u_y = a_{21} v_x + a_{22} v_y,  \quad (1)$$

where the matrix coefficients $a_{11}$ and $a_{22}$, respectively, are adjustable in an interval of from 0.9 to 1.1 for setting the tilt point of the x- and y-format deflection into the plane of the first intermediate pupil, and the matrix coefficients $a_{12}$ and $a_{21}$, for example, adjustable within an interval of $-0.1$ to $+0.1$ for rotating the deflection direction of the upper stage relative to the lower stage.

Such a device has the following advantages:

The focusing of the crossover image into the tilt plane of the format varying system permits a considerably coarse adjustment and a rotation of the deflection direction in the upper stage caused by the rotational lens in the course of the parallelogram correction can be compensated for in a simple manner.

A sixth feature of the invention relates to the monitoring of the format adjustment by use of a strongly magnifying projection system the radiation of which passes the target plane for being displayed on a screen.

The system includes a switchable intermediate lens for displaying the target plane or the plane of the entrance pupil on the screen.

By virtue of the imaging system cyclic format positioning in the target plane is performed in such a manner that an area is uniformly illuminated over an average time provided that the format is correctly adjusted and calibrated.

Said illuminated area is geometrically congruent to that area which is constructed through translation of the format in units of its edge vectors by direction and absolute value. When a format is misaligned or not calibrated bright and dark areas occur due to overlapping of, respective, spaces between the edges of the cyclicly positioned formats. The kind of aberration is detected from the shape of the bright or dark areas.

In the event of pupil aberrations the illumination intensity is different in the four adjacent edges of the cyclic positioned format.

In order that the invention may be more readily understood reference is made to the accompanying drawings which illustrate a diagrammatically and by way of example one embodiment thereof and in which.

Figure 1:
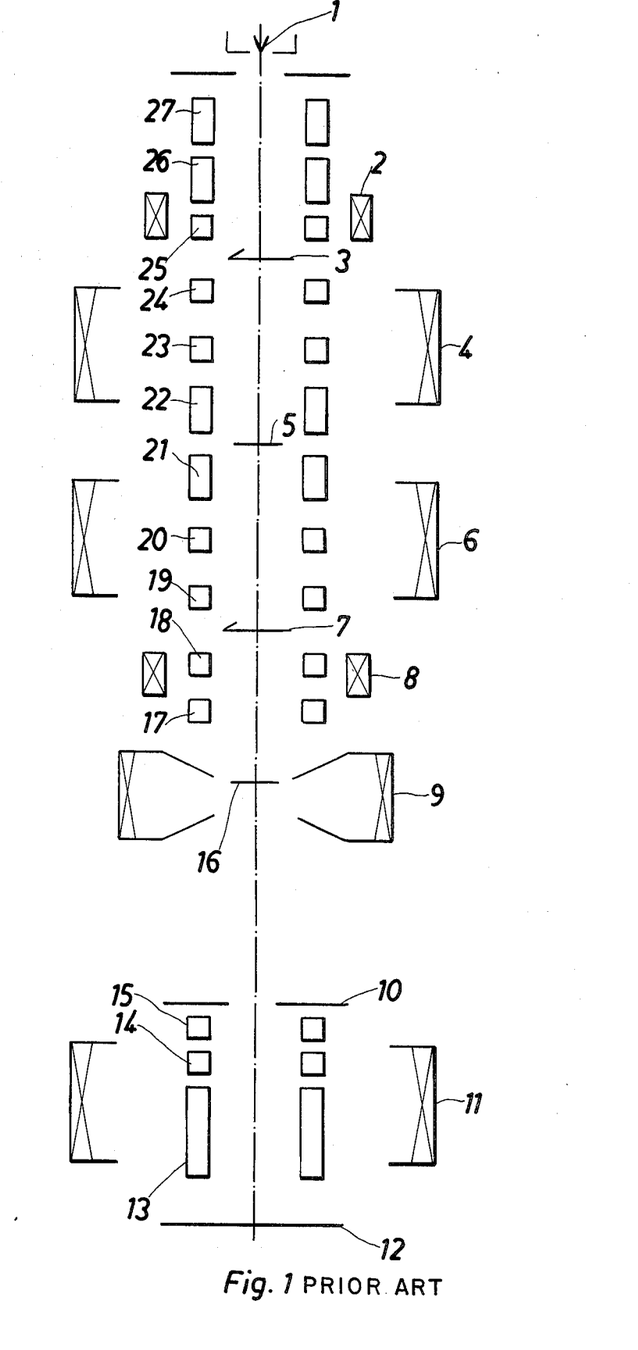
FIG. 1 shows an electron optical column of an electron beam device of the previous art.

FIG. 1 shows an electron optical device of the previous art. Two angular and optically complementary apertures 3 and 7 limit an electron beam originating from a crossover 1. The excitation of the condenser lenses 4 and 6 is so selected that the angular aperture 3 is imaged into the plane of the angular aperture 7 and that the crossover 1 is imaged into the plane of an aperture diaphragm 10 through an intermediate lens 9 preferably operated at a maximum of its refractive power.

In the course thereof an intermediate image of the crossover 1 is produced in a plane centrally located relative to a beam shaping system 21 and 22, hereinafter refered to as format deflection system. Said intermediate image represents a first intermediate pupil in the plane 5 of which the virtual tilt point of the deflection system 21 and 22 is arranged.

Provided that the angle sides of the angular apertures 3 and 7 include right angles a rectangular beam cross-section is produced due to the image reversion effected by an equal excitation of the condenser lenses 4 and 6, poled reversely to each other, when the two apertures 3 and 7 are installed parallel to each other.

The rectangular beam cross-section obtained lies in the plane of the angular aperture 7. The cross-section is demagnified and imaged through an intermediate lens 8 and an electron optical lens 11 into a target plane 12.

The limitation of the beam cross-section has the feature of being composed of two parts, the one part being the image of a mechanically solid beam limitation, the angular aperture 3, and the other part being the image of a further mechanically solid beam limitation, the angular aperture 7.

Each for its own is not capable to shape the beam cross-section, hereinafter refered to as format.

Apart from the mechanical adjustment state of the angular apertures and of the condenser lenses the format is determined by the field strength of the format deflection system 21, 22 and permits a variation in two dimensions as fast as the position of the beam cross-section in the target plane 12, which cross-section is set by operation of a beam positioning system 13.

Since the latter system 13 can be controlled electronically just as the deflection system 21, 22, it is feasibly to position the electron beam upon any desired position of the field of operations and to shape the beam cross-section to any desired size within the optically possible format range.

When it is desired to produce a pre-programed pattern on the target, a blanking system 19 deflects the crossover image in the plane of the aperture diaphragm 10 so that the beam cross-section is correspondingly bright-dark scanned in the target plane 12.

Since the blanking aperture of the beam which images the illumination field plane in 7 is narrow compared to the aperture in the target plane according to the imaging scale of the illumination field plane relative to the target plane, already a low excitation of the blanking system 19 suffices to blank out the beam cross-section without substantially varying its format and its position on the target.

It is also feasible to employ a second deflection system 24 in synchronous operations with the blanking system 19 arranged below the angular aperture 3 so that the image of the angular aperture 3 is not displaced in the target plane in the course of the blanking or scanning operation. Thus the electron beam cross-section can be rapidly and accurately bright-dark controled in the target plane.

There are further electron-optical means provided to align automatically the electron beam relative to the angular aperture 3 and the aperture diaphragm 10, to measure the beam intensity in the cross-section and to stigmatize the image of the illuminated field in the target plane. To this end a two-staged deflection system 26, 27 is provided for centering the electron beam upon the angular aperture 3 having its tilt about the crossover 1, and for centering the crossover image, the third intermediate pupil, into the aperture diaphragm having its tilt about the angular aperture 3.

A deflection system 17 serves to blank out the electron beam over the aperture diaphragm 10 to measure the beam intensity in that state.

Stigmators 14 and 15 are provided to compensate for two and three numbered astigmatism of the illumination field image in the target plane.

The electron optical illumination system includes electron optical means for affecting the electron beam in such a manner that it appears in the desired intensity and format in the target plane. Said electron optical means comprises stigmators 18, 20, 23, 25 and auxiliary condenser lenses 2 and 8.

The condenser lenses 4 and 6 serve to rotate the image of the angular aperture 3 relative to the angular aperture 7. The intermediate lens 9 is capable of rotating the format entirely.

The task of the stigmators 25 and 20 is to compensate for pupil astigmatism in the plane 5 of the first intermediate pupil and in the plane of the aperture diaphragm 10. The stigmators 23 and 18 have to adjust the angular apertures with respect to the orthogonality of their sides.

However, said stigmators do not fulfill this task without back-effects. So, for example, the stigmator 20 affects the vertex angle in the image of the angular aperture 3, just as the stigmators 23 and 18 do with respect to the pupil astigmatism.

Hence, the setting of the stigmators becomes complicated and time consuming.

Furthermore the electron optical device does not include any means which are capable to decide whether or not there is any astigmatic aberration in the first intermediate pupil.

The adjustment of the optical parallelity of opposing sides of the beam format requires a setting of the sides in the image of the angular aperture 3 parallel to the corresponding sides of the angular aperture 7. This is feasible at a respective setting of the two stigmator 20, 23 excitations and of the condenser lenses 4 and 6, without a variation of the pupil astigmatism in the aperture diaphragm 10 and the condition that the image of the angular aperture 3 upon the angular aperture 7 is maintained.

Due to the elliptic distortion which is effected by the astigmators 20 and 23 the vertex angle of the two sides in the image of the angular aperture 3 can be varied and, due to the image rotations, which are effected by the two condenser lenses 4 and 6 when oppositely excited, the image of the angular aperture 3 can be entirely rotated.

This, inevitably involves an axial displacement of the first and the third intermediate pupil.

In order to correct this defocusing the auxiliary condenser lenses 2 and 8 are provided.

The above described adjustment operations are very complicated and time consuming due to the numerous back-effects.

The inventional solution which eliminates the above disadvantages will be explained in the following Figures.

Figure 2:
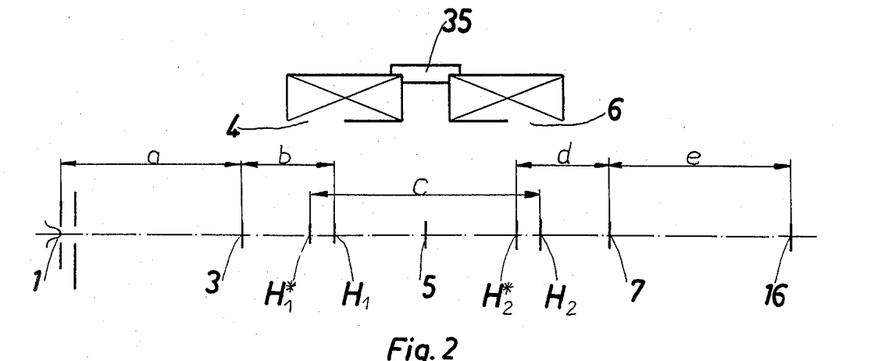
FIG. 2 is a schematical view of the condenser lens system dimensioned according to the present invention.

In FIG. 2 a first feature of the invention is illustrated in particularly pointing out those distances which are relevant in dimensioning the condenser system. a is the distance between a crossover 1 and an angular aperture 3, b the distance between the angular aperture 3 and object side principal plane $H_1$ of a condenser lens 4, c the distance between the image side principal plane $H_1^*$ of the condenser lens 4 and the object side principle plane $H_2$ of a condenser lens 6, d the distance between the image side principal plane $H_2^*$ of the condenser lens 6 and the angular aperture 7, and e the distance between the angular aperture 7 and the plane 16 of the second intermediate pupil which is magnified by the intermediate lens 9 and imaged into the aperture diaphragm 10.

Since the principle planes are only displaced insignificantly when the excitation of the condenser lenses 4 and 6 are only slightly varied, the distances a, b, c, d, e are virtually mechanically defined lengths.

When the condenser lenses are dimensioned to satisfy the relation $$D = 1 - 4\frac{b}{c} \cdot \frac{d}{e}\left(1 + \frac{b}{a}\right)\left(1 + \frac{d}{e}\right) = 0 \quad (2)$$

there will be a definite excitation range of the condenser lenses 4 and 6 in which when imaging the crossover 1 into the plane 10 of the aperture diaphragm also the angular aperture 3 is imaged into the plane of the angular aperture 7.

Figure 3:
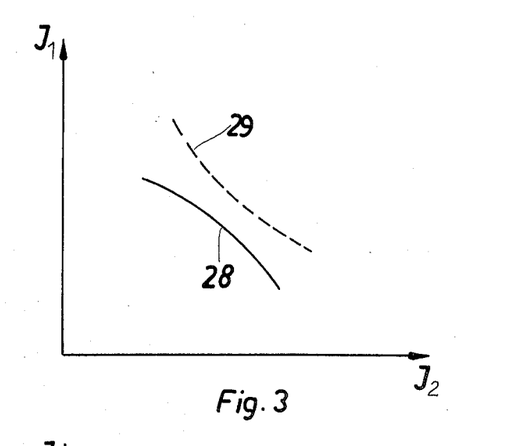
FIGS. 3, 4, 5 are graphs for illustrating a function of the condenser lens system dimensioning relative to the maximum condenser lens excitation at the desired imaging of the angular apertures and the crossover.
Figure 4:
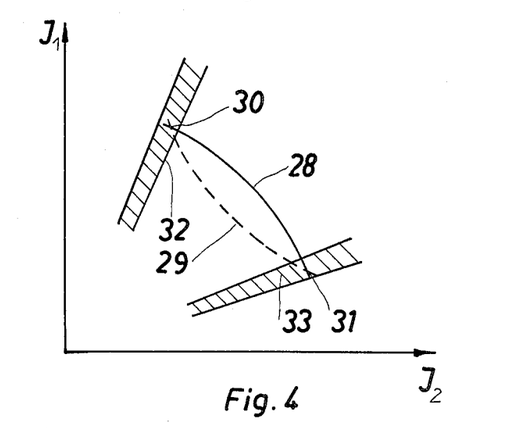
Figure 5:
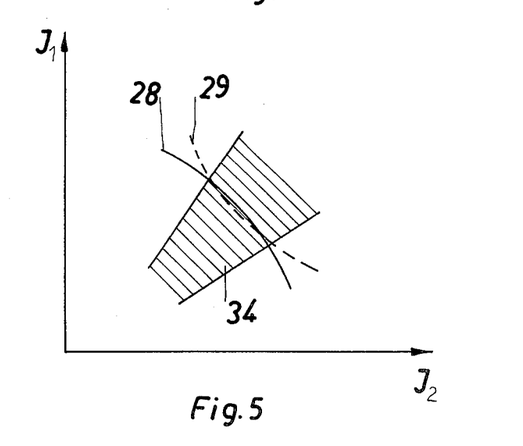

In FIGS. 3 to 5 a curve 28 represents the function of the excitation $I_1$ and $I_2$ of the two condenser lenses 4 and 6, provided that the imaging of the angular aperture 3 upon the angular aperture 7 is satisfied. A curve 29 in dashed lines is a function of the excitations $I_1$ and $I_2$ under the condition that the crossover 1 is imaged into the plane 10 of the aperture diaphragm. When the discriminant $D<0$ then there will be no excitation of the condenser lenses 4 and 6 (in FIG. 3) in which the two images are simultaneously obtained.

When the discriminant $D>0$ then, according to FIG. 4 two definite excitation states exist, the intersections 30 and 31 in which a simultaneous imaging is obtained. However, the statement that the pupil is focused into the plane 10 of the aperture diaphragm, does not necessarily involve that the angular aperture 3 is imaged into the plane of the angular aperture 7.

This condition is only satisfied when the excitations $I_1$ and $I_2$ do not leave the narrow ranges 32 and 33. These ranges exist due to the considerable definition in depth of the image of the angular apertures permitting a certain tolerance with respect to the curve 28.

When the condenser system is dimensioned to yield $D=0$ the range 34 as shown in FIG. 5 is considerably wide so that the resulting tolerance zone for the condenser lens excitation also permits a coarse adjustment of the parallelity of the angular aperture imaging and/or a coarse adjustment of the first intermediate pupil onto the tilt plane of the format deflection system.

This is of importance insofar as the setting ranges of the matrix coefficients for the coupling (1) and for the rotation lens 38 (FIG. 6) need not be wide.

In order to dimension the entire system to $D=0$ a spacing cylinder is provided the length of which can also be obtained empirically, when the production tolerance do not permit an exact defination.

A single empiric setting is performed by aid of the measured curves 28 and 25, the course of which, as in FIGS. 3 and 4, permits a calculation of lengths of the spacing cylinder 35 which can be calculated by a simple formula.

To measure exactly the functional relation between the condenser lens excitation $I_1$ and $I_2$, which results in the curve 28, the intermediate lens is advantageously switched off and furthermore the aperture is artificially opened by wobbling the beam centering 26, 27 having its tilt about the angular aperture 3. This adjustment is suitable for a single pre-centering but not for a routine operation since it is very time consuming.

Apart from the symmetrical displacement of the condenser lenses 4 and 6 by virtue of the inventional spacing cylinder 35, also an axial displacement can be obtained, for example, by varying the width of the iron yokes of the condenser lenses 4 and 6 by inserting washers, without substantially any back-effects upon the adjustment $D=0$.

A common axial displacement varies the difference of those excitations of the condenser lenses 4 and 6 in which the crossover 1 is imaged both onto the tilt plane of the format deflection systems 21, 22 and onto the plane 10 of the aperture diaphragm.

A variation of the difference of the oppositely poled condenser lens excitations involves a variation of the image rotation angle of the image of the angular aperture 3 in the plane of the angular aperture 7.

Thus a coarse adjustment of the sides of the angular apertures is feasible with respect to parallelity so that the setting ranges of the rotation lens 38 and the coupling matrix 36 are only intended for a fine adjustment. The variation of the widths of the washers which effect displacement of the condenser lenses 4 and 6 both in the same and in the opposite direction can be represented as a linear compositum of difference of uniquely defined excitations, which are determined by one of the following four conditions: imaging of the aperture 3 onto the diaphragm 7 at a preferably equal excitation $J_1=J_2$, imaging of the angular aperture 3 onto the angular aperture 7 at parallel sides of the images of the aforesaid apertures 3 and 7, imaging of the crossover 1 onto the plane 10 of the aperture diaphragm at a preferably equal excitation $J_1=J_2$, imaging of the crossover 1 onto the plane 10 of the aperture diaphragm at an invariance of the location of the pupil relative to a variation of the format.

Figure 6:
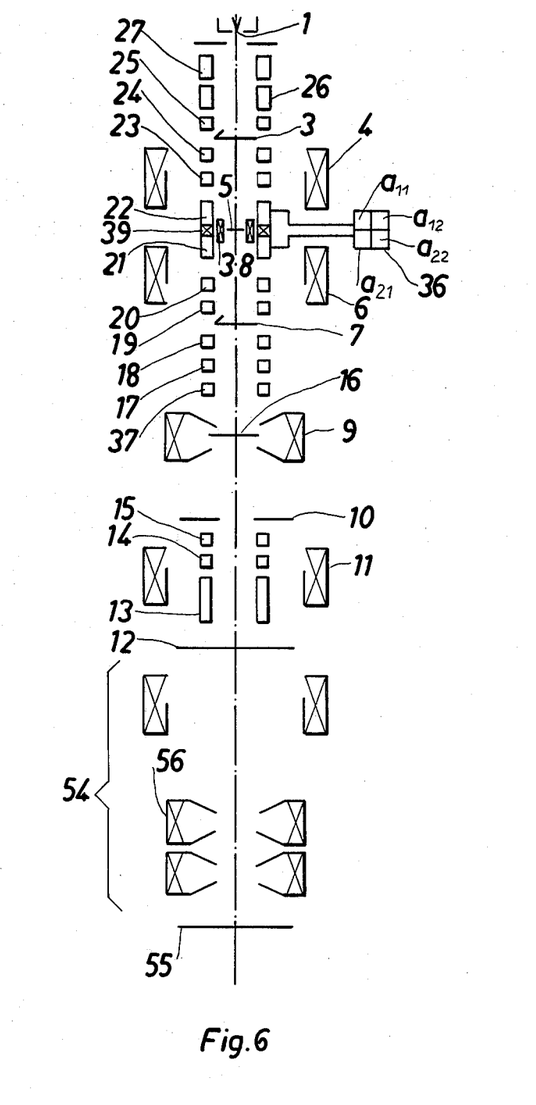
FIG. 6 is a schematical representation of the inventional electron optical system.
Figure 7:
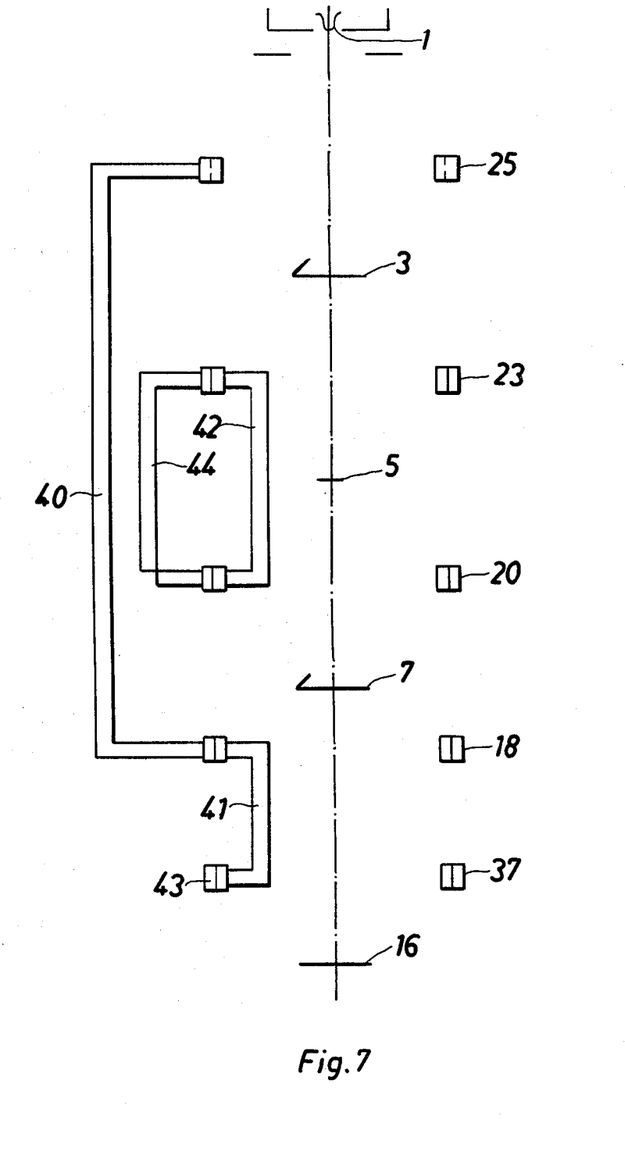
FIG. 7 shows schematically a circuit for connecting the quadrupoles and stigmators, respectively, FIG. 8 a graph representing the fundamental course of curves effected by the means according to FIG. 7.

In FIGS. 6 and 7 the inventional solutions with respect to the illumination system according to features two to five are illustrated.

In the following there are concerned a rotation lens 38, a wobbling rotation lens 39, a reversely connected stigmator doublet 40, a reversely in sequence connected stigmator doublet 41, a reversely in sequence connected quadrupole doublet 42, a quadrupole 43, a series connected stigmator doublet 44 and the coupling matrix 36. The rotation lens 38 is of the air-cored solenoid type consisting of a few number of layers of, for example, one hundred windings each, wound upon an interiour cylinder of that body upon which the format deflection system is provided symmetrically to the central plane of the latter. Said system permits a rotation of the image of the angular aperture 3 in the plane of the angular aperture 7 by about $\pm 3°$ at a maximal current of 100 $\mu$A and a beam potential of about 30 millivolt.

Due to its arrangement about the plane 5 of the first intermediate pupil substantially no defocusing of the second and third, respectively, intermediate pupil will occur at said excitation parameters.

The only back-effect consists in a rotation of the deflection direction of an upper stage 22 of the format deflection system which leads to transversal pupil deflection when the format is changed.

Said pupil deflection, however, can be compensated by means of the coupling matrix 36 (matrix coefficients $a_{12}$, $a_{21}$), with respect to the deflection currents and does not occur in the course of the adjustment of the parallel sides of the angular aperture imaging, provided that the format deflection system is without current.

The coupling matrix 36 satisfies a further function, namely the fine adjustment of the tilting plane of the format deflection system into the plane 5 of the first intermediate pupil which is obtained via the matrix coefficient $a_{11}$ with respect to the x-deflection direction and $a_{22}$ with respect to the y-deflection direction.

This function was heretofore carried out by the auxiliary condenser lens 2 (FIG. 1) which can now be omitted, just as the auxiliary condenser lens 8.

The latter becomes superfluous since, due to the dimensioning of the condenser lens system D=0, the focusing of the pupil into the plane 10 of the aperture diaphragm is carried out by setting the condenser lens excitation, at which also the imaging of the angular aperture 3 onto the plane of the angular aperture 7 is ensured, as shown in FIG. 5.

The wobbling rotation lens 39 which is excitable five times stronger compared to the rotation lens 38 is arranged symmetrically to the central plane of the format deflection system. The wobbling rotation lens 39 has the task to detect astigmatism, if any, in the first intermediate pupil.

The lens 39 can be excited in a manner that the image rotation between the plane of the first intermediate pupil and the plane of the third intermediate pupil, the plane 10 of the aperture diaphragm is alternately changed about ±15°. The criterion whether or not the first intermediate pupil is stigmatical, is the constancy of the pupil astigmatism in the plane 10 of the aperture diaphragm, observed in the course of wobbulating the rotation lens 39, or provided that the pupil appears stigmatised in the aperture diaphragm, the maintenance of the stigmatic image of the crossover 1 in the plane 10 of the aperture diaphragm.

In order to exemplify the realisation of the fourth feature according to the invention in a simple manner, it is assumed that the condenser lens system is symmetrically dimensioned to D=0, under the condition of a=e and b=d.

This involves the advantage that the stigmators and quadrupole, respectively, can be of the same type when using a simple current supply.

Advantageously, said same type comprises four concentrically arranged cylindrical quadrupoles adjacently located one above the other (q, r, s, t). Each quadrupole consists of four saddle coils symmetrically arranged and electrically connected with respect to their azimuth.

Each of said four saddle-coils has the same number of windings. Two quadrupoles are azimuthally in parallel and two pairs of quadrupoles are azimuthally rotated to each other by 45°.

The electrical coil winding terminals of the quadrupoles of each system of four are led out singly and are connected in pairs to the quadrupoles of the other system of four according to a definite regulation, schematically shown in FIG. 7 and clarified by the following description.

Figure 8:
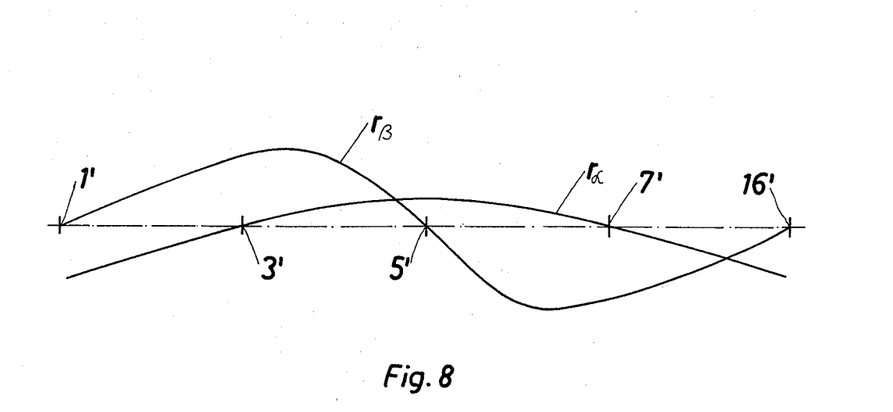

FIG. 8 shows the typical curves $v_x$ and $v_s$ of the paraxial differential equations with respect to the condenser lens system.

The basic curve $r_\alpha$ has zero positions in the axial points 3' and 7' of the angular apertures 3 and 7, respectively, and the basic curve $r_\beta$ has zero positions in the axial point 1 of the crossover 1, in the axial point 5' of the first intermediate pupil and in the axial point 16' of the second intermediate pupil, conjugate to the axial point of the aperture diaphragm 10 via the intermediate lens 9.

Said basic curves $r_\alpha$ and $r_\beta$ are factors in the integrands of the integrals with respect to the astigmatism and the elliptic distortion of weak quadrupole fields.

The integrand for the pupil astigmatism includes $r_\beta^2$ as a factor and the integrand for the elliptic distortion of the image of the angular aperture includes $r_\alpha \cdot r_\beta$ as a factor.

According to the invention two quadrupoles arranged along the optical axis one after the other are in series connected and reversely connected, respectively, so that the desired effect is enhanced and the non-desired effects are suppressed.

To this end the quadrupoles connected to a quadrupole doublet of different systems of four hereinafter refered to as SF are aligned azimuthally in parallel. The systems of four (SF) are arranged along the optical axis in direction of beam propagation as follows in FIG. 6.

$A\eta$SF 25 is arranged above the angular aperture 3 at the same distance as $a\eta$SF 18 is located below the angular aperture 7.

The SF 18 and $a\eta$SF 37 are symmetrically arranged to the midpoint of the distance e of FIG. 2.

$A\eta$SF 23 and $a\eta$SF 20 are symmetrically located to a central plane between the condenser lenses 4 and 6. A quadrupole s of the SF 23 is electrically connected in series to the quadrupole s of the SF 20.

Said quadrupole doublet s SF 23+s SF 20 produces an astigmatism in the image of the angular aperture 3 in the plane of the angular aperture 7.

A further quadrupole doublet t SF 23+t SF 20, constituted in analogy to the quadrupole doublet s SF 23+s SF 20, being rotated about 45°, results in a stigmator doublet 44 which serves to compensate for a focusing difference in the imaging relation between the two angular apertures 3 and 7 without any variation of the elliptic distortions.

A pupil astigmatism occuring as a back-effect is compensated through the stigmator doublets 40 and 41, respectively.

The quadrupole q SF 23 is connected in reverse direction to the quadrupole q SF 20.

This quadrupole doublet q SF 23−q SF 20, refered to in FIG. 7 with 42, only produces elliptic distortions in the image of the angular aperture 3, considering the condenser image rotation the quadrupole doublet 42 is azimuthally arranged in such a manner that the major axis of the distortion ellipsis lies about the angle bisecting line of the angular aperture.

As a secondary effect of the quadrupole doublet 42 the astigmatism in the first intermediate pupil is varied, the astigmatism in the second and third intermediate pupil remains unchanged.

The quadrupole s of the SF 25 is reversely connected to the quadrupole s of the SF 18.

The resulting quadrupole doublet s SF 25−s SF 18 produces an astigmatism in the first intermediate pupil without any back-effects upon the second intermediate pupil.

A combination of the latter quadrupole doublet with a quadrupole t SF 25−t SF 18 rotated by 45° results in a stigmator doublet 40 to effect an astigmatism in the first intermediate pupil without any variation of the astigmatism in the second and third intermediate pupil.

A secondary effect is an elliptic distortion which influences the vertex angles in the image of the angular apertures in same portions and can be compensated for by the quadrupole 43. The quadrupole s SF 37, in FIG. 7 designated with 43, has its axes in parallel and at right angles, respectively, to the sides of the angular aperture 7 and serves to vary the vertex angle in the image of the angular apertures and hence to effect an orthogonality of the four sides of the already parallelogram shaped beam format obtained by the means mentioned hereinbefore.

A secondary effect is a slight astigmatism in the second and third intermediate pupil which is compensated for by means of the stigmator doublet 41 without any back-effects. The quadrupole q of the SF 18 is reversely connected to the quadrupole q of the SF 37.

The resulting quadrupole doublet q SF 18/q SF 37 produces a pupil astigmatism in the second intermediate pupil without any secondary effects, that is, without any elliptical distortion of the angular aperture imaging. The combination of the latter quadrupole doublet with a quadrupole doublet r SF 18−r SF 37 rotated about 45° results in a stigmator doublet 41 for compensating a pupil astigmatism in the second and third intermediate pupil without variation of the angular position of the sides in the image of the angular apertures, that is, without any directional variation of the four sides of the beam cross-section.

According to the sixth feature of the invention the format adjustment is carried out under observation of the beam cross-section in the target plane.

The cross-section of the beam is displayed upon a screen 55 after strongly magnifying the former through an imaging system 54. The latter also permits the display of the plane 10 of the aperture diaphragm by simply inserting an intermediate lens 56.

The beam cross-section in the currentless state of the format deflection system has a substantially square format (zero format), of a mean edge length, which has about half the length of the greatest possible square format. The format adjustment has the task to set the imaged sides of the angular apertures 3 and 7 in the target plane in parallel to the substantially right angular x, y deflection directions of the positioning system 13. The setting components are the intermediate lens 9 in its function as a rotation lens to rotate the entire format, the quadrupole 43, the rotation lens 38 and the quadrupole doublet 42.

The control signal is provided by a periodical jump of the excitation current in the leads of the positioning deflection system with respect to the x-deflection system, and by a periodical jump 90° phase shifted in the excitation system of the y-deflection system.

A jump width matched to the zero-format, or vice versa, a substantially square format irradiated field will be produced over an average time.

Said format will show more or less wide wedge-shaped dark or bright zones at the adjacent sides of the jump zero-formats, depending on the state of the format adjustment.

Figure 9:
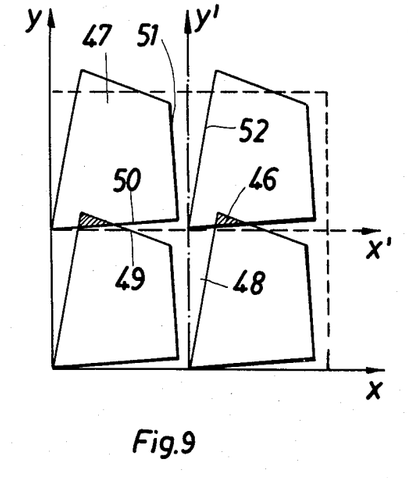
FIG. 9 is a diagram exemplifying the format adjustment, FIG. 10 a further diagram according to FIG. 9, FIG. 11 another diagram according to FIG. 9, and FIG. 12 still another diagram according to FIG. 9.

In FIG. 9 none of the four sides of the beam format is aligned relative to the deflection directions of the positioning system 13.

The double irradiated zones 46 are considerably brighter than the single irradiated zones 47, which contrast to the dark background 48.

The non-parallel edges 49 and 51, respectively, of the beam opposing each other in the vicinity of the origin of the (X', Y') coordinates in the image of the angular apertures 3 and 50, 52, respectively, in the image of the angular aperture 7 can be eliminated by means of the rotation lens 38 and the quadrupole doublet 42.

Figure 10:
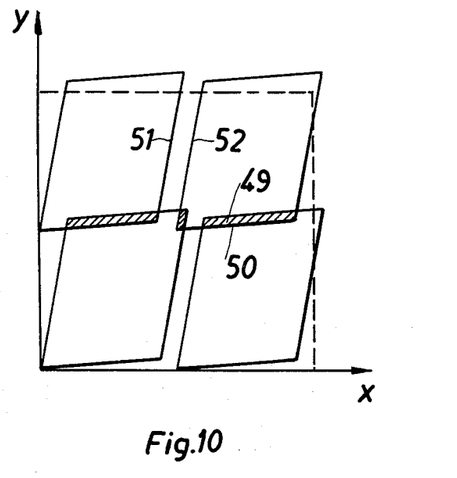

Thus the adjustment state as shown in FIG. 10 is obtained in which the respective opposing sides 49 to 52 are parallel to each other.

The alignment relative to the X and Y deflection directions is obtained by means of the variable image rotation due to the intermediate lens 9 and the elliptical distortion of the quadrupole 43.

Figure 11:
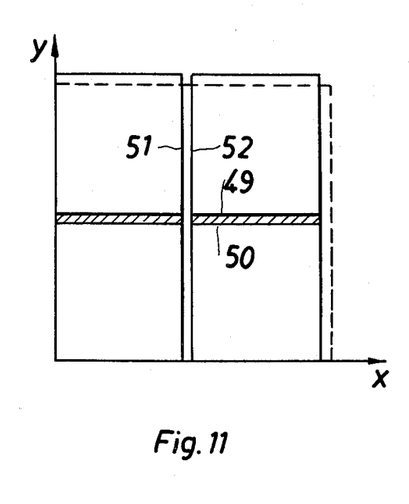

The format adjustment is finished when the state shown in FIG. 11 is obtained.

The format adjustment is followed by a format calibration based on the equation for the format control $$\begin{pmatrix} v_x \\ v_x \end{pmatrix} = \begin{pmatrix} 1 & 0 \\ 0 & 1 \end{pmatrix} \begin{pmatrix} N_x \\ N_y \end{pmatrix} + \begin{pmatrix} b_{11} & b_{12} \\ b_{21} & b_{22} \end{pmatrix} \begin{pmatrix} \phi_x \\ \phi_y \end{pmatrix} \quad (3)$$

Figure 12:
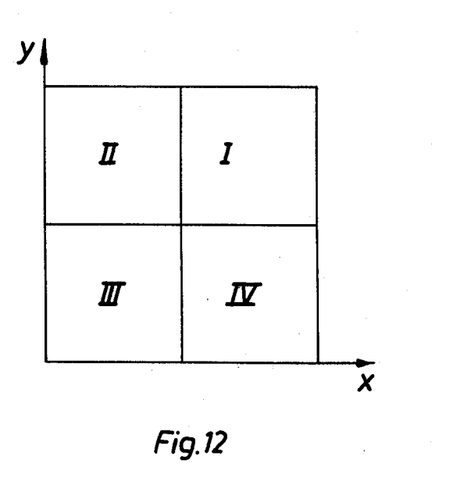

The adjustment sizes $N_x$ $N_y$ permit an accurate matching of the zero format sides to the size of the jump widths in the x, y-deflection direction of the positioning system as shown in FIG. 12.

The format is varied through the format control vectors $\phi_x$, $\phi_y$, in which a variation of $\phi_x$ about $\Delta\phi_x$ has to be varied exactly by $\Delta_x$, $\Delta_y=0$, and a variation of $\phi_y$ about $\Delta\phi_y$ has to be varied exactly about $\Delta x=0$, $\Delta y$.

To satisfy this condition the format control vectors $\phi_x$, $\phi_y$ are additively combined with the current vectors $v_x$, $v_y$ via the coupling matrix, the matrix coefficients $b_{11} \ldots b_{22}$ are set by the following method:

In the jump III position as shown in FIG. 12, the zero-format is displaced in the x-deflection system of the positioning system 13 about $\Delta x$ and the format opened about $\Delta\phi_x$ for balancing.

Figure 13:
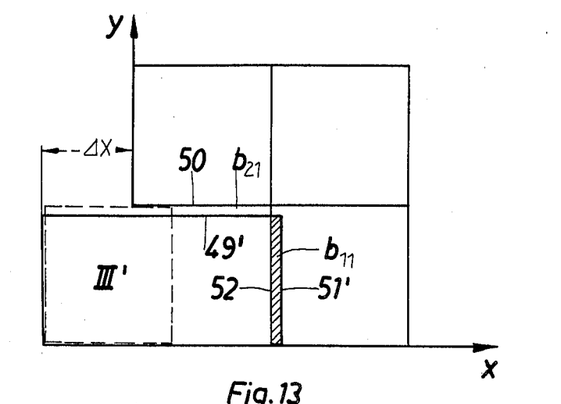
FIG. 13 shows a diagram for format calibration, FIG. 14 another diagram according to FIG. 13, FIG. 15 still another diagram according to FIG. 13.

Since the deflection direction of the format deflection system also depends on the setting of the coupling matrix ($a_{11} \ldots a_{22}$) and the rotation lens 38 the beam edges 49, 51 in the image of the jump III' of the angular aperture 3 are displaced in parallel to the beam edges 50, 52 of the imaged jumps II and IV, respectively, of the angular aperture 7 (FIG. 13). The edges are aligned relative to each other by setting the matrix coefficients $b_{11}$, $b_{12}$.

In analogy thereto, the matrix coefficients $b_{21}$; $b_{22}$ are set. According to FIG. 14 the positioning system displaces the zero-format in the jump IV in y-deflection direction about -y and, for compensation, the format is opened about $\Delta\phi y$.

Figure 14:
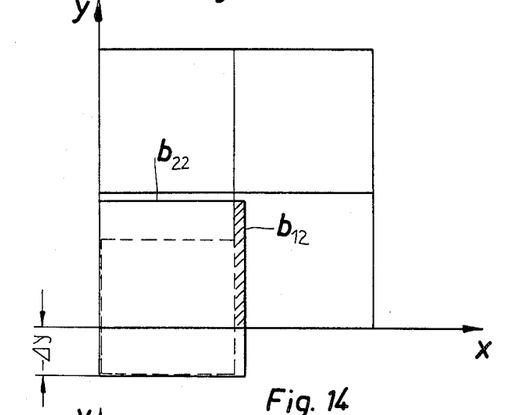

The signs for x, y can of course be reversed and the jump test can be carried out, for example, by a slit format.

Figure 15:
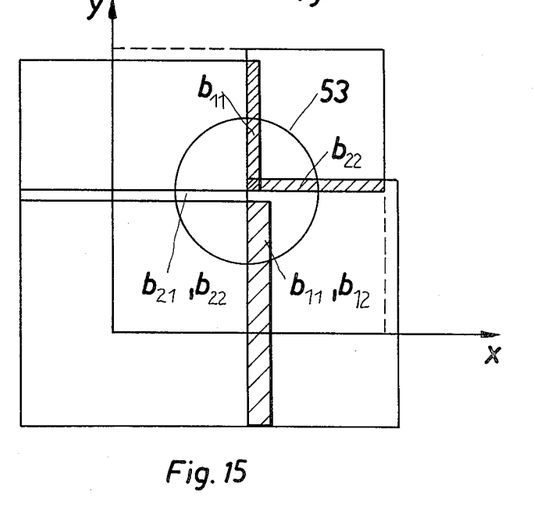

When the sequence of jumps is suitably controlled, the operations as disclosed with respect to FIGS. 13 and 14 can be combined to yield an operation according to FIG. 15. In the field of view 53 the adjacent edges disclose the variations effected via the setting of the matrix coefficients ($b_{11} \ldots b_{22}$) of the format control. Furthermore, a brightness comparison of the four adjacent corners of the cyclic positioned formats is indicative of the pupil adjustments.

The field of view is of equal brightness when the system is in an adjusted state.

In the following the adjustment operation is described in specifying the sequence of the imaging of the electron beam cross-section, the essential features of the departures from an adjusted state and the steps to correct the aberrations.

In a first step the aperture diaphragm is imaged and the pupil is focused into said plane by operating the excitation of the series connected excitation coils of the condenser lenses 4 and 6.

In a second step the target plane is imaged and the zero format is cyclically positioned.

The feature of the aberration is a wedge error of the kind as shown in FIG. 9.

The aberration is corrected by operating the quadrupole doublet 42 and through the rotation lens 38.

In a third step the aperture diaphragm is imaged and the wobbling rotation lens 39 is energised.

The aberration concerned is the inconstancy of the pupil astigmatism which is eliminated through the stigmator doublet 40.

This step, though very advantageous, can be omitted. In a fourth step the target plane is imaged and the zero-format is cyclically positioned.

The aberration concerned is the parallelogram error of the kind refered to in FIG. 10 which is compensated through the quadrupole 43 and the intermediate lens 9 functioning as a rotation lens.

In a fifth step the target plane is imaged.

The aberration concerned is the distance error of the kind as shown in FIG. 11 which is compensated for by the setting values $N_x$, $N_y$ of the zero-calibration of the format.

In a sixth step the aperture diaphragm is imaged and the pupil astigmatism is compensated for by means of the stigmator doublet 41.

In a seventh step the aperture diaphragm is imaged and the format is cyclically positioned, according to FIGS. 13 and 14.

The aberration concerned are longitudinal and transversal pupil displacements which are compensated for via the matrix coefficients $a_{11}$ and $a_{22}$, respectively, and $a_{12}$ and $a_{21}$ respectively, of the coupling matrix 36.

In an eighth and final step the target plane is imaged and the format is cyclically positioned according to FIG. 15.

The distance errors at the cross-wire arms are compensated for via the setting matrix coefficients $b_{11} \ldots b_{22}$ of the format control matrix.

The eighth step closes the adjustment operations.

The pupil adjustment is monitored via a brightness comparison of the four quadrants I to IV abutting in the center of the field of view, which is representative of the irradiation intensity in the four corners of the large-size format of FIG. 15 (jump position III).

The aforementioned embodiments relate to the use of an scanning aperture the opening of which is so dimensioned that it is also effective as an aperture diaphragm.

When the irradiated background outside of the proper crossover image is sufficiently low the opening of the scanning aperture can be far greater.

This involves the advantage that the setting sensitivity of the pupil adjustment can be reduced.

In this event it is feasible to increase artificially the aperture of the angular aperture image by wobbling the beam-centering 26, 27 which has its tilt about the angular aperture 3, without the necessity of switching off the intermediate lens 9.

Thus the setting sensitivity of the image of the angular aperture 3 in the plane of the angular 7 is enhanced. In this case the spacing cylinder 35 is so defined that the crossover is imaged onto the optically most suitable plane of the entrance pupil of the objective 11, when the excitation of the series connected excitation coils of the condenser lenses 4 and 6 is set to sharply image the angular aperture 3 into the plane of the angular aperture 7.

In general the optically most suitable plane lies within the field of the objective 11.

In the sequence of the operational steps 3, 6 and 7 the imaging of the aperture diaphragm is here to be understood as imaging of the entrance pupil.

In the sequence of the operational steps 1 to 8 the first step is substituted by:

Imaging of the angular apertures and wobbling of the beam centering having its tilt about the angular aperture 3. The aberration concerned is an oscillation of the sides in the image of the angular aperture 3, which is eliminated by operation of the series connected excitation coils of the condenser lenses 4 and 6.

A still remaining opposite focus difference of the two sides in the image of the angular aperture 3 is compensated for by the stigmator doublet 44.

I claim:

1. A method of adjusting a shaped-electron-beam working device in which a first angular aperture is imaged onto the plane of a second angular aperture completing each other such that a rectangularly shaped beam results which is demagnified via an objective into a target plane and which is positioned therein through an x, y-deflection system, and in which a crossover of said shaped-electron-beam working device is imaged into the tilt plane of a format deflection system for format variation and from there onto the plane of an aperture diaphragm (entrance pupil) of said objective, adjustments of the pupil, of the beam format and of a beam format calibration being performed comprising in time sequence the steps of displaying the electron beam shape image in the target plane on a screen, displaying the image of the entrance pupil on the screen, checking the images of said beam shape and said entrance pupil, and in the event of misalignments from an adjusted state prevailing the following adjustment steps are performed:

imaging the aperture diaphragm and focusing of the pupil onto the plane of the aperture diaphragm for pre-adjustment of the pupil, imaging of the target plane and cyclically positioning of a zero-format in x, y-deflection direction in the target plane in the step width of the zero-format and correcting the wedge error (non-parallel opposing sides), the parallelogram error, the distance error, and the brightness differences visible at the format edges of four adjacent edges of the zero-format for format adjustment where the zero-format is the cross-section of the beam in the currentless state of the format deflection system, imaging of the aperture diaphragm and cyclic format variation, phase shifted in x, y-direction, and subsequent correction of the pupil displacement occurring in the course thereof, for pupil adjustment, imaging of the target plane and cyclic positioning of the format with simultaneous format variation, and correction of the distance error visible at the format edges for format calibration.

2. A method of adjusting a shaped-electron-beam working device as claimed in claim 1, wherein the step of correcting the wedge error is followed by an additional step of again imaging the aperture diaphragm and an inconsistency of the pupil astigmatism rendered visible through beam wobbling is eliminated.

3. A method for adjusting a shaped-electron-beam working device as claimed in claim 1, wherein the step of imaging the aperture diaphragm and focusing of the pupil onto the plane of the aperture diaphragm is substituted by a step of imaging the angular aperture and wobbling the beam centering having its tilt about the first angular aperture and a subsequent elimination of an oscillation of the angle sides in the image of the first angular aperture and a residual reverse focus difference of the two angle sides of the first angular aperture.

4. A device for adjusting a shaped-electron-beam working device in which a first angular aperture is imaged via a condenser lens system into the plane of a second angular aperture completing each other in such a manner that a rectangular beam cross-section is obtained being demagnified through an intermediate lens and an objective and imaged into a target plane, and being deflected therein by means of a positioning system, and in which a crossover of a beam generating means is imaged via a first condenser lens into the tilt plane of a two-staged deflection system for format variation of the beam cross-section and from there via a second condenser lens and said intermediate lens into the plane of the entrance pupil of the objective, and in which a beam centering means is provided for directing the electron beam into the first angular aperture and onto an aperture diaphragm (blanking aperture) arranged in the plane of the entrance pupil, and in which at least two stigmators are provided for affecting the electron beam, characterized in that a distance a between the crossover and the first angular aperture, a distance b between the first angular aperture and the object side principle plane of the first condenser lens, a distance c between the image side principle plane of the first condenser lens and the object side principle plane of the second condenser lens, a distance d between the image side principle plane of the second condenser lens and the second angular aperture, and a distance e between the second angular aperture and the plane of a second intermediate pupil being dimensioned in such a manner that the equation $$D = 1 - 4\frac{b}{c} \times \frac{d}{c}\left(1 + \frac{b}{a}\right)\left(1 + \frac{d}{e}\right) \text{ equals zero,}$$

and in that a rotation lens is arranged between the first and second condenser lens, and in that the condenser lens system comprises weakly excitable quadrupoles arranged in groups, said groups being constituted of two quadrupoles commonly electrically operated, said quadrupoles in said groups being arranged and electrically connected in such a manner that, when compensating for astigmatism, the astigmatic effect of a first of said quadrupoles is in series with the astigmatic effect of a second of said quadrupoles, and the elliptic distortion of said first is compensated for by the elliptic distortion of said second of said quadrupoles, and when said groups being operative for correcting the elliptic distortions (wedge error), the distortion effect of said first of said quadrupoles is in series with the distortion effect of said second of said quadrupoles, and the astigmatic effect of said first compensates the astigmatic effect of said second of said quadrupoles, and in that the deflection currents $u_x$, $u_y$ of the upper stage of said two-staged format deflection system and the deflection currents $v_x$, $v_y$ of the lower stage of said two-staged format deflection system are operable according to an affine transformation $$u_x = a_{11} v_x + a_{12} v_y$$

$$u_y = a_{21} v_x + a_{22} v_y$$

where $a_{11}$, $a_{22}$ and $a_{12}$, $a_{21}$ are coefficients adjustable in an interval of from 0.9 to 1.1 and $-0.1$ to $+0.1$, respectively, and in that an electron optical projection system is arranged subsequent to said target plane, said projection system including a switchable intermediate lens for imaging said target plane and the plane of the entrance pupil upon a screen.

5. A device for adjusting a shaped-electron-beam working device as claimed in claim 4, wherein a wobbling rotating lens is arranged between said first condenser lens and said second condenser lens.

* * * * *